United States Patent [19]

Kirkpatrick

[11] 4,179,324

[45] Dec. 18, 1979

[54] PROCESS FOR FABRICATING THIN FILM AND GLASS SHEET LAMINATE

[75] Inventor: Allen R. Kirkpatrick, Lowell, Mass.

[73] Assignee: Spire Corporation, Bedford, Mass.

[21] Appl. No.: 855,418

[22] Filed: Nov. 28, 1977

[51] Int. Cl.$^2$ .................... B29C 19/02; B32B 31/00
[52] U.S. Cl. ............................. 156/230; 156/272; 156/289
[58] Field of Search ............... 156/272, 230, 289, 247, 156/249, 344

[56] References Cited

U.S. PATENT DOCUMENTS

| 3,397,278 | 8/1968 | Pomerantz | 156/272 |
| 3,554,832 | 1/1971 | Fischer | 156/230 |

*Primary Examiner*—Douglas J. Drummond

*Attorney, Agent, or Firm*—Morse, Altman, Oates & Bello

[57] ABSTRACT

A semiconductor thin film and glass stratum laminate is formed by depositing a semiconductor thin film onto a temporary substrate having a carbon coating to which the film adheres. Processing of the semiconductor thin film for selected performance characteristics is accomplished while the film is affixed to the temporary substrate. The processed thin film is transferred and electrostatically bonded to the glass stratum by exposure to a thermal environment at or below the softening point of the glass stratum and by application of an electric potential across the thin film and glass. The bonded thin film and glass stratum laminate is separated from the temporary substrate.

10 Claims, 1 Drawing Figure

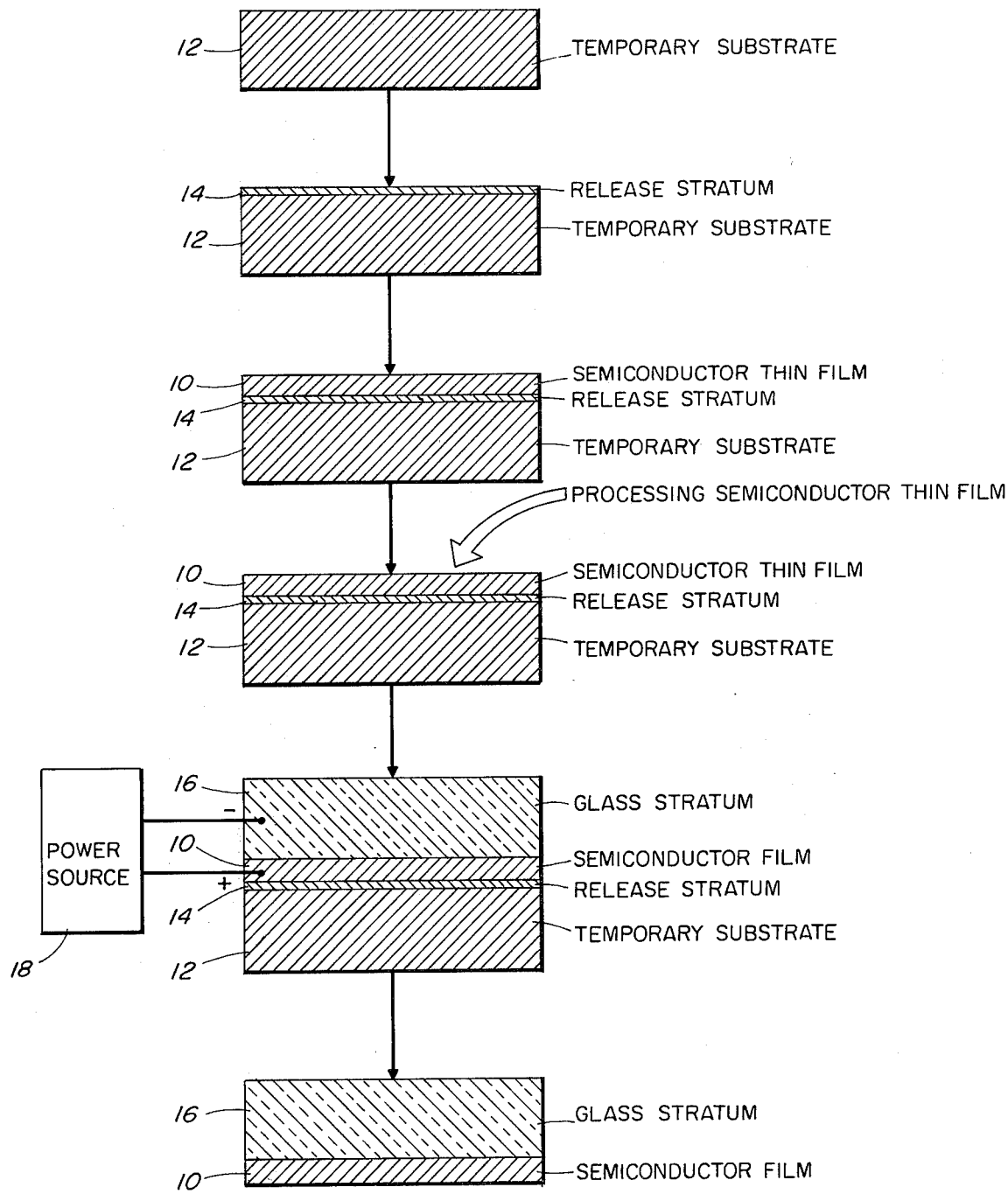

PROCESS FOR FABRICATING THIN FILM AND GLASS SHEET LAMINATE

BACKGROUND OF THE INVENTION

1. Field of Invention

The present invention relates to a thin film devices and, more particularly, is directed towards processes for fabricating semiconductor thin film and glass sheet laminates.

2. Description of the Prior Art

The characteristics of thin films, such as silicon films, depends upon the method used for its deposition, the substrate material, the temperature of the substrate during initial deposition and post deposition processing such as thermal anneal. It is very difficult to directly deposit adherent, large grain polycrystalline silicon films onto a glass sheet. In the past, film deposition or post-deposition annealing at substrate temperatures which exceed the temperature limitations of most glasses have been used in order to achieve large grain structure. A need exists for improvements in the fabrication of semiconductor thin film and glass sheets laminates.

SUMMARY OF THE INVENTION

An object of the present invention is to provide a novel process for fabricating thin film and glass sheet laminates.

Another object of the present invention is to provide a process for fabricating semiconductor thin film and glass sheet laminates without subjecting the laminate to excessive thermal exposure. In one example, a semiconductor thin film is deposited onto a temporary substrate having a carbonaceous release coating, the thin film being deposited onto the carbonaceous coating. Preselected processing of the thin film is performed while it is attached to the temporary substrate. The processed thin film is placed in contact with a glass sheet to which it is to be electrostatically bonded. The processed thin film and glass sheet are exposed to a thermal environment that is at or below the softening point of the glass sheet and is below the temperature limitations of the glass sheet. The thermal environment is such that the glass sheet becomes somewhat ionically conductive. While in this thermal environment, an electric potential is applied across the thin film-glass laminate, the glass biased negatively with respect to the film. In certain instances, it has been found advantages to apply a pressure in the range of 100 to 1000 psi to the thin film-glass laminate. Upon completion of the steps of thermal exposure and electric potential application, the temporary substrate, carbonaceous coating, thin film and glass sheet laminate is cooled. Finally, the film and glass sheet structure is released from the temporary substrate at the carbon coating interface.

Other objects of the present invention will in part be obvious and will in part appear hereinafter.

The invention accordingly comprises the methods together with their steps and interrelationships that are exemplified in the following disclosure, the scope of which will be indicated in the appended claims.

BRIEF DESCRIPTION OF THE DRAWING

A fuller understanding of the nature and object of the present invention will beome apparent upon consideration of the following detailed description taken in connection with the accompanying drawing, wherein the FIGURE shows exaggerated cross-sectional views of materials undergoing a process of the present invention.

DETAILED DESCRIPTION OF THE PREFERRED EMBODIMENTS

The present invention involves a process of fabricating a bonded thin film and glass sheet structure using a temporary substrate for processing of the thin film prior to bonding of the film and glass sheet.

According to the process of the present invention, a semiconductor thin film 10, such as silicon or germanium or a dielectric oxide such as silicon oxide or tantalum oxide, is deposited onto a temporary substrate 12 to which the film does not adhere strongly. In one embodiment, the thickness of temporary substrate 12 is in the range of 5 $\mu$m to 600 $\mu$m, specifically 250 $\mu$m. Deposition of thin film 10 is accomplished by vacuum evaporation, chemical vapor deposition, sputtering or the like. In one example, the thickness of the deposition thin film 10 is in the range of 0.05 $\mu$m to 100 $\mu$m, specifically 20 $\mu$m. Temporary substrate 12 is composed of a material which is not adversely affected by high temperatures in the range of 300° C. to 1400° C., such as silicon, graphite, metal or ceramic. For particular applications, temporary substrate 12 is selected for certain characteristics such as a substantially different expansion coefficient from that of thin film 10, expansion coefficient matched to the thin film material, the capability of withstanding corrosive environments, the capability of withstanding high temperatures, and so forth. In the preferred embodiment, prior to deposition of thin film 10, temporary substrate 12 is coated with a surface layer 14 constituting a releasing interface by sputtering, evaporation, chemical decomposition and the like. Surface layer 14, which has a thickness in the range of 0.02 $\mu$m to 100 $\mu$m, specifically 0.5 $\mu$m, is composed of a carbonaceous material such as graphite.

Semiconductor thin film 10 is deposited onto surface layer 14 on the temporary substrate 12 in the manner previously discussed. In one example, substrate 12 is maintained at an optimum temperature during film deposition. After deposition of thin film 10 on graphite layer 14, special processing such as heat treatment for crystallization purposes, ion implant for introduction of dopant, chemical treatment, mechanical work, and so forth is performed on deposited thin film 10. The purpose of the special processing is to improve thin film 10 characteristics and to provide predetermined performance charactersitics.

Upon completion of the special processing steps, a glass stratum 16 is superposed on processed thin film 10. In one embodiment, the thickness of glass stratum 16 is in the range of 100 $\mu$m to 1000 $\mu$m, preferably 250 $\mu$m. If desired, electrodes are placed behind glass stratum 16 and behind thin film 10. Glass stratum 16 and thin film 10 are heated to a temperature which is at or below the softening point of the glass, for example a temperature in the range of 300° C. to the softening point of the glass. Preferably, glass stratum 16 and thin film 10 are heated to a temperature which is between the annealing and softening points of the glass for example a temperature in the range of 500° C. to 700° C. In this thermal environment, glass stratum 16 becomes somewhat ionically conductive. An electric potential from a source 18, for example a voltage in the range of one hundred to ten thousand volts, is applied across the thin film-glass pair, the glass being biased negatively with respect to the film. In consequence, an electrostatic field is produced at the thin film-glass interface which draws the surfaces into close contact and a permanent bond is formed between the thin film and glass. It is believed that the permanent bond is achieved through ion induced chemical bonding at the interface. In one embodiment, a pressure in the range of 100 to 1000 psi, preferably 200 to 600 psi, is applied to the film-glass pair while the electric potential is applied thereto.

Next, temporary substrate 12, surface coating 14, thin film 10 and glass sheet 16 laminate is cooled to room temperature. When the thermal expansion coefficients of temporary substrate 12 and glass sheet 16 are substantially different, thin film 10 is released from surface layer 14 during cooling. When the thermal expansion co-efficients of temporary substrate 12 and glass sheet 16 are not substantially different, a mechanical force or a chemical reaction is employed after cooling to release thin film 10 from the temporary substrate. In one example, mechanical release of the thin film and glass sheet laminate from temporary substrate 12 is accomplished by pulling apart the temporary substrate and thin film-glass sheet laminate. In another example, a knife edge is inserted at the interface of release surface coating 14 and thin film 10.

It will be apparent from the foregoing description that the process of the invention in which a temporary substrate is utilized in the fabrication of thin film and glass sheet laminate has numerous advantages. The characteristics of temporary substrate 12, such as thermal expansion properties, surface texture, shape and so forth are chosen for deposition of thin films having particularly desirable characteristics. The process of the invention is suited for use in situations where deposition conditions for the thin film material are not compatible with the physical limitations of the glass sheet, such as high temperatures or corrosive environments. After deposition of the thin film onto the temporary substrate and prior to electrostatically bonding of the film and glass sheet, film processing operations are performed on the thin film that could not be performed on the glass sheet due to the physical limitations of the glass sheet. For example, the thin film is annealed, recrystallized, diffused, etc. at high temperatures which exceed the thermal limitations of the glass sheet. In another example, the film is exposed to chemical environments that would have adverse effects on the glass sheet. In the special processing of the deposited film in order to fabricate a more complex structure, the exposed film surface is available for processing. This exposed surface, which is later electrostatically bonded to the glass sheet, is not available if the thin film is deposited directly onto the glass sheet before processing. Similarly, after separation of the thin film and glass sheet laminate from the temporary substrate, the opposite surface of the thin film is available for processing. That is, both surfaces of the thin film are available for processing such as diffusion, implantation, polishing, chemical treatment, addition of material and so forth.

The present invention allows certain operations to be performed on the glass sheet prior to the electrostatic bonding step which are not feasible in the case of direct deposition of the thin film material onto the glass sheet. In one example, a metal film electrical grid pattern is prepared on the glass sheet to make contact with and/or from the thin film to be transferred from the temporary substrate. In certain instances, the thermal and atmospheric requirements for film deposition adversely effects the metal film. That is, the film deposition requirements are such that metal interacts unfavorably with the thin film material. The electrostatic bonding of the thin film to the glass sheet, in most cases, provides greater adhesion properties than that provided by deposition processes.

Since certain changes must be made in the foregoing disclosure without departing from the scope of the invention herein involved, it is intended that all matter contained in the above description be construed in an illustrative and not in a limiting sense.

What is claimed is:

1. A method for fabricating a thin film and glass stratum laminate comprising the steps of:
 (a) depositing applying thin film material onto a temporary substrate by a deposition process;
 (b) superposing a glass stratum on said thin film;
 (c) exposing said superposed glass stratum and thin film to a thermal environment which does not exceed the softening point of said glass stratum;
 (d) electrostatically bonding said glass stratum and said thin film; and
 (e) removing said temporary substrate from said bonded thin film and glass stratum laminate structure.

2. The method as claimed in claim 1 including the step of coating said temporary substrate with a release layer, said thin film deposited onto said release layer.

3. The method as claimed in claim 1 wherein said glass stratum and said processed thin film material are electrostatically bonded together while exposed to said thermal environment.

4. The method as claimed in claim 3 wherein said electrostatic bonding includes the steps of exposing said processed thin film material and said glass stratum to a thermal environment in the range of 300° C. to the softening point of said glass stratum, applying an electric potential across said superposed glass stratum and processed thin film, and applying a pressure in the range of 100 to 1000 psi to said glass stratum and thin film.

5. The method as claimed in claim 4 wherein said electric potential is in the range of 100 volts to 10,000 volts, said glass stratum biased negatively with respect to said deposited thin film material.

6. A method for fabricating a semiconductor thin film and glass stratum laminate comprising the steps of:
 (a) coating a temporary substrate with a release layer;
 (b) depositing a semiconductor thin film onto said release layer;
 (c) processing said semiconductor thin film;
 (d) superposing a glass stratum on said deposited semiconductor thin film;
 (e) electrostatically bonding said glass stratum to said processed semiconductor thin film in a thermal environment which does not exceed the softening point of said glass stratum; and
 (f) separating said temporary substrate from said electrostatically bonded glass stratum and semiconductor film laminate.

7. The method as claimed in claim 6 including the step of exposing said deposited thin film to selected conditions which exceed certain physical limitations of said glass stratum before superposing said glass stratum on said thin film.

8. A method for fabricating a semiconductor thin film and glass stratum laminate comprising the steps of:
 (a) coating a temporary substrate with a release layer;

(b) depositing a semiconductor thin film onto said release layer;
(c) processing said semiconductor film;
(d) superposing a glass stratum on said deposited semiconductor thin film;
(e) electrostatically bonding said glass stratum to said processed semiconductor thin film in a thermal environment which does not exceed the softening point of said glass stratum; and
(f) separating said temporary substrate from said electrostatically bonded glass stratum and semiconductor film laminate;
(g) said electrostatic bonding step including the steps of exposing said processed semiconductor thin film and said glass stratum to a thermal environment in the range of 500° C. to 700° C., applying an electrical potential across said glass stratum and said semiconductor thin film, said glass stratum biased negatively with respect to said processed semiconductor thin film, and applying pressure in the range of 100 to 1000 psi to said semiconductor thin film and said glass stratum.

9. The method as claimed in claim 8 wherein said separating step includes cooling said temporary substrate, said release coating and said semiconductor thin film and said glass stratum composite to room temperature.

10. The method as claimed in claim 9 wherein said temporary substrate and said semiconductor thin film have substantially different thermal expansion coefficients, said semiconductor thin film separating from said temporary substrate during said cooling step.

* * * * *